United States Patent
DeHerrera et al.

(10) Patent No.: US 7,088,608 B2
(45) Date of Patent: Aug. 8, 2006

(54) REDUCING POWER CONSUMPTION DURING MRAM WRITES USING MULTIPLE CURRENT LEVELS

(75) Inventors: Mark F. DeHerrera, Chandler, AZ (US); Bengt Johan Akerman, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 40 days.

(21) Appl. No.: 10/737,114

(22) Filed: Dec. 16, 2003

(65) Prior Publication Data

US 2005/0128795 A1 Jun. 16, 2005

(51) Int. Cl.
*G11C 11/00* (2006.01)
(52) U.S. Cl. ...................... 365/158; 365/173
(58) Field of Classification Search ................ 365/158, 365/148, 171
See application file for complete search history.

(56) References Cited

U.S. PATENT DOCUMENTS

| | | | |
|---|---|---|---|
| 5,844,755 A * | 12/1998 | Yamane et al. | 257/E23.179 |
| 6,028,786 A * | 2/2000 | Nishimura | 365/173 |
| 6,074,707 A * | 6/2000 | Nakazawa et al. | 427/547 |
| 6,385,086 B1 | 5/2002 | Mihara et al. | |
| 6,421,277 B1 | 7/2002 | Tsunesada | |
| 6,531,723 B1 | 3/2003 | Engel et al. | |
| 6,545,906 B1 | 4/2003 | Savtchenko et al. | |
| 6,683,815 B1 * | 1/2004 | Chen et al. | 365/225.5 |

* cited by examiner

Primary Examiner—Thong Q. Le

(57) ABSTRACT

A reduced power method of writing MRAM bits is disclosed. The reduced power method includes writing MRAM bits by applying a first magnetic field having a low magnitude, then determining if the bit has switched. If not, a second magnetic field having a higher magnitude is applied. Applying magnetic fields to an MRAM bit cell is accomplished by sending a current pulse through a strip line adjacent to the MRAM bit cell. The technique can be performed for every write to an MRAM bit. Alternatively, the weaker magnetic field can be applied during system test or system initialization, and if the weaker field fails to write the bit to a desired value, the failing result is stored and each subsequent write to the MRAM bit utilizes the stronger magnetic field.

26 Claims, 4 Drawing Sheets

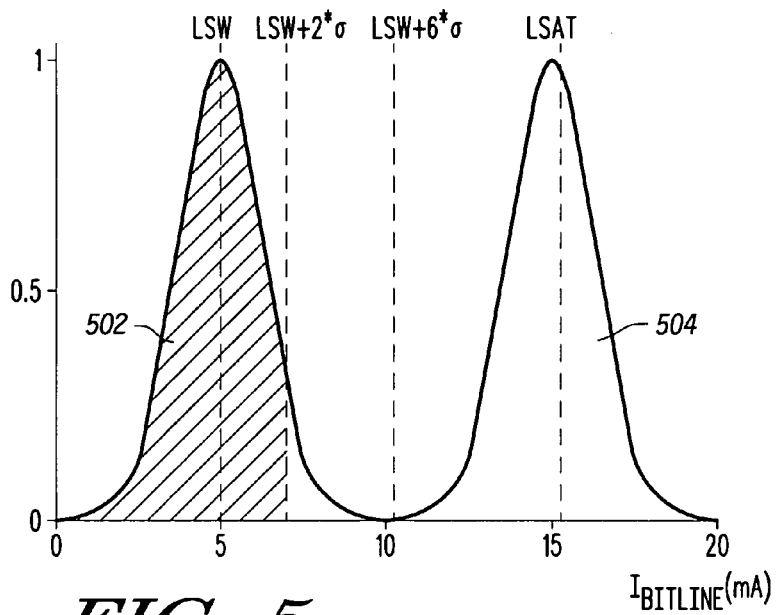
FIG. 5
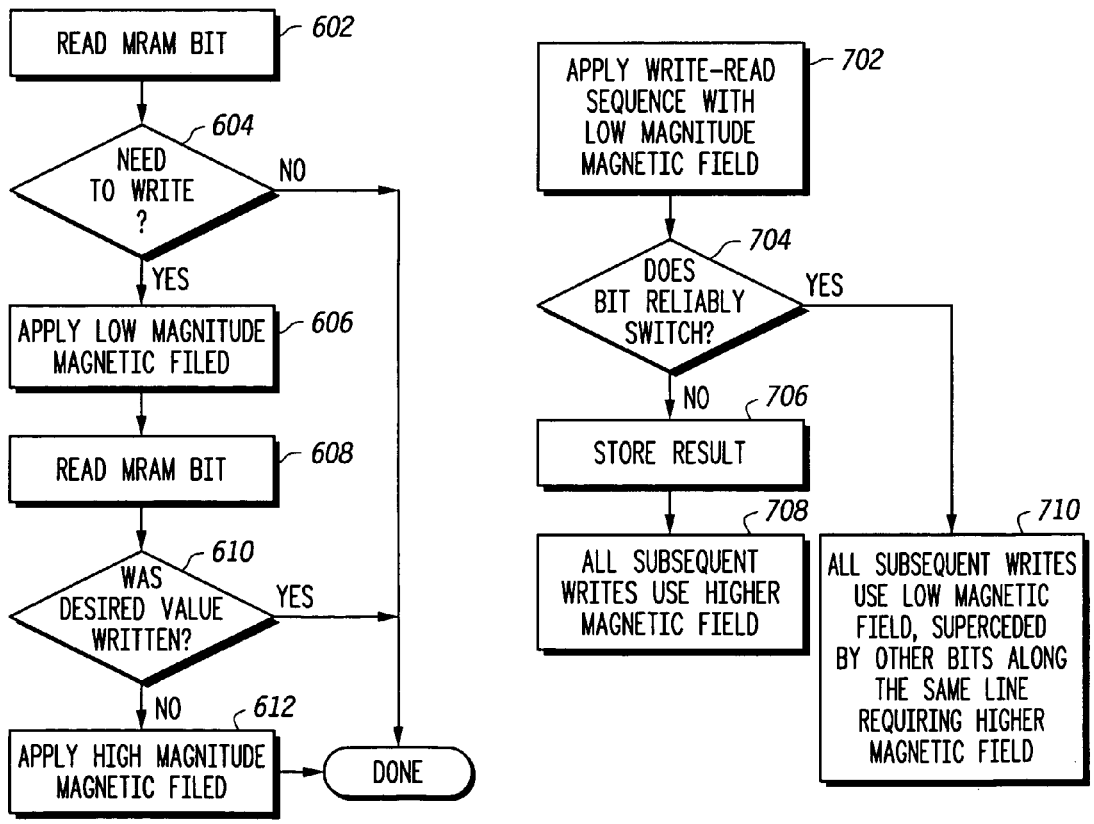
FIG. 6   FIG. 7

REDUCING POWER CONSUMPTION DURING MRAM WRITES USING MULTIPLE CURRENT LEVELS

BACKGROUND

1. Field of the Disclosure

This disclosure relates to semiconductor memory devices, and, more particularly, to semiconductor random access memory devices that utilize a magnetic field.

2. Description of the Related Art

Non-volatile memory devices are an important component in electronic systems. Flash memory is the major non-volatile memory device in use today. Typical non-volatile memory devices use charges trapped in a floating oxide layer to store information. Disadvantages of Flash memory include high voltage requirements and slow program and erase times. Also, Flash memory has a poor write endurance before memory failure. In addition, to maintain reasonable data retention, the scaling of the gate oxide is restricted by the tunneling barrier seen by the electrons. Hence, Flash memory is limited in the dimensions to which it can be scaled.

To overcome these shortcomings, magnetic memory devices are being evaluated. One such device is magnetoresistive random access memory (hereinafter referred to as "MRAM"). To be commercially practical, however, MRAM should have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

A typical embodiment of an MRAM circuit involves, but is not limited to, having each bit in proximity to two lines that are orthogonal to one another, with one line being below the bit and one line being above the bit. This grouping of bit and two lines will hereafter be referred to as a "bit cell". Arraying the bit cells into a grid pattern causes one line to form columns (hereafter referred to as the "bit line" and the other line to form rows (hereafter referred to as the "digit line"). The MRAM device can be written using two distinct modes; a conventional write mode or a toggle write mode.

In the conventional write mode, the state of the MRAM cell is switched only if the state that is written is different than the state that is stored, and the polarity of the current in one or both of the digit or bit lines determines the memory state that is written. In the conventional write mode, it is necessary that at least one of the write lines be capable of passing current in two directions. In one embodiment, field generated by the digit line in a given bit cell reduces the energy barrier to reversal for the bit in that cell. Field generated by a bit line in this cell may then reverse the direction of the magnetic moment of the bit if it is in the opposite direction to the magnetic moment of the bit before field application and greater than the now-reduced energy barrier.

In the toggle write mode, the state of the MRAM cell is switched every time a sequence of strategically-timed pulses is generated from both the bit and digit lines. In the toggle write mode, it is not necessary that either of the write lines be capable of passing current in two directions. Since the memory state changes with each application of the write pulse sequence, the initial state of the MRAM cell is determined prior to each write. After comparing the stored memory state with the new state to be written, the MRAM device is written if the stored state and the new state are different. The toggle write mode is disclosed in U.S. Pat. No. 6,545,906 (herein after '906) entitled "METHOD OF WRITING TO SCALABLE MAGNETORESISTANCE RANDOM ACCESS MEMORY ELEMENT", issued to Savtchenko et al. on Apr. 8, 2003 and incorporated herein by reference in its entirety.

In one implementation of the conventional switching mode, the digit line provides a "half-select" field to a row of bits within an array, reducing the energy barrier to reversal for the entire row. A bit line is simultaneously energized, selecting the bit at the intersection of the energized bit line and energized digit line for writing. The bit line current, $I_{bit}$, necessary to switch the bit at a given digit line current, $I_{digit}$, is defined as $I_{sw}(I_{digit})$. $I_{sw}(I_{digit})$ is lowered as $I_{digit}$ is increased. $I_{sw}(I_{digit})$ for bits within an array follows a gaussian distribution, where $\sigma_{sw}(I_{digit})$ is the one-sigma switching distribution of the bits at a given $I_{digit}$. Therefore, the MRAM device must supply approximately $I_{sw}(I_{digit})+6*\sigma_{sw}(I_{digit})$ to write the bits with an error rate of about 1 in $10^9$ bits switching unreliably. The non-half-selected switching field of a given bit is $I_{sw}(0)$. It is necessary that $I_{sw}(I_{digit})+6*\sigma_{sw}(I_{digit})<I_{sw}(0)-6*\sigma_{sw}(0)$ or disturb errors will occur along the bit line. It is also necessary that $I_{digit}$ be low enough such that $I_{sw}(I_{digit})-6*\sigma_{sw}(I_{digit})>0$ or disturb errors will occur along the digit line.

A typical implementation of the toggle switching mode is similar to the conventional switching mode in that the bits are in an array with orthogonal bit line and digit lines. However, in this case there is no "half-select" upon the application of a single field. Both lines work together in a strategically-timed sequence to rotate the magnetic moment of the bit 180 degrees with each application of write pulses. The current required to switch MRAM bits follows a gaussian distribution for each write line. The MRAM device must supply approximately $6*\sigma_{sw}$ over the mean switching current ($I_{sw}$) on both lines. There is also a point on each line where too much field has been applied and the bit no longer switches reliably. This is the saturation current, or $I_{sat}$. Therefore, to ensure that less than 1 in $10^9$ bits switches unreliably, the following condition must be met for both lines: $I_{sw}+6*\sigma_{sw}<I_{sat}-6*\sigma_{sat}$.

Due to the aforementioned constraints, or "windows", in reliably switching both conventional-mode and toggle-mode MRAM, it is disadvantageous to apply more current during a write than is absolutely necessary to switch the bits. There are several other reasons to reduce the write currents as well. For instance, a half-selected bit sharing a row with and neighboring a selected bit may experience enough field to switch if the half-selected bit switches in the lower end of the switching distribution and the write current is too high. This is known as a "neighboring bit disturb" and can be alleviated by reducing the over-drive write current by reducing $\sigma_{sw}$ or the number of $\sigma_{sw}$ over $I_{sw}$ that is applied. Also, since the power consumed during a write is the resistance of each line times its write current squared, a small reduction in write current equates to a large reduction in power used. In addition, electromigration effects increase with current magnitude, so reducing the currents through the write lines improves part reliability.

BRIEF DESCRIPTION OF THE DRAWINGS

The present disclosure may be better understood, and its numerous features and advantages made apparent to those skilled in the art by referencing the accompanying drawings.

FIG. 5 illustrates switching and saturation distributions for toggle-mode MRAM bits in an array according to an embodiment of the present disclosure.
FIG. 6 illustrates a flow diagram of a reduced power write method according to an embodiment of the present disclosure.
FIG. 7 illustrates another flow diagram of a reduced power write method according to an embodiment of the present disclosure.

The use of the same reference symbols in different drawings indicates similar or identical items.

DESCRIPTION OF THE EMBODIMENT(S)

According to the present disclosure, a reduced power method of writing MRAM bits is disclosed. The reduced power method includes first attempting to write to the MRAM bits using a low magnitude magnetic field and determining if the bit has switched. If the write was not successful, a second, higher magnitude magnetic field is used to write the bit. Applying a magnetic field to an MRAM bits is accomplished by sending a current pulse through a strip line adjacent to the MRAM bits. Thus, lower current pulses can be used for a portion of MRAM bits in an array, saving power consumed.

Various embodiments are disclosed. In a first embodiment, the above method is performed for every write to an MRAM bit. In another embodiment, the weaker magnetic field is applied during system test or system initialization, and if the weaker field fails to meet an objective, such as to toggle the stored value, an indication of the failed objective is stored and each subsequent write to the MRAM bit utilizes the stronger magnetic field.

Figure 1:
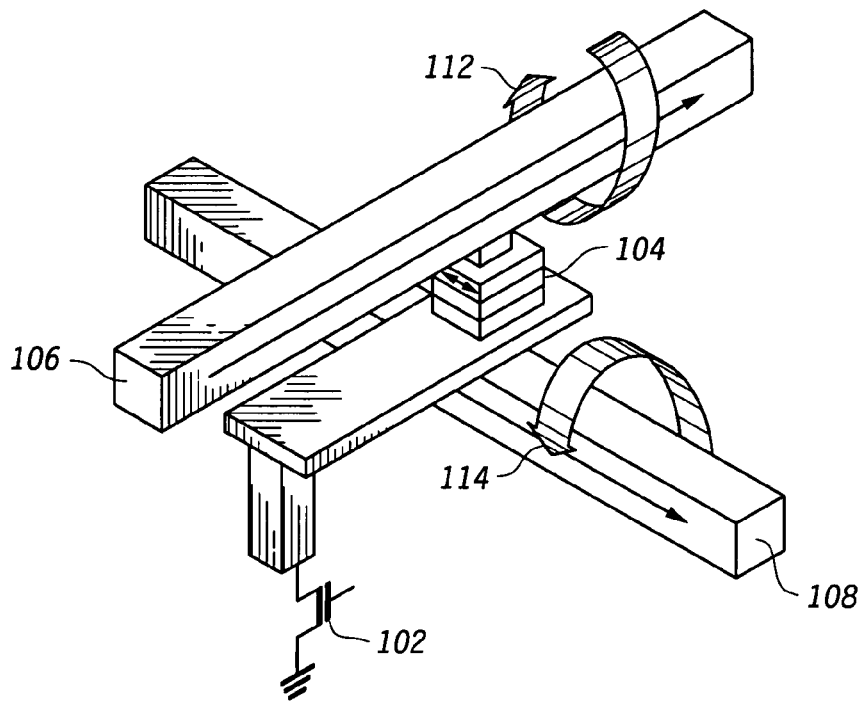
FIG. 1 illustrates a write mode operation of an MRAM bit.

FIG. 1 illustrates a write mode operation of an MRAM bit. In a write mode, isolation transistor 102 is turned off. MRAM bit 104 is written by sending current through a bit line 106 and/or a digit line 108. Current through bit line 106 and digit line 108 produce magnetic fields 112 and 114 respectively. Magnetic fields 112 and 114 cause a value to be stored in MRAM bit 104. In conventional write mode, the direction of the current sent through bit line 106 and digit line 108 determines the value stored in MRAM bit 104. In a toggle mode, a sequence of current pulses in a same direction toggles a stored value in MRAM bit 104.

Figure 2:
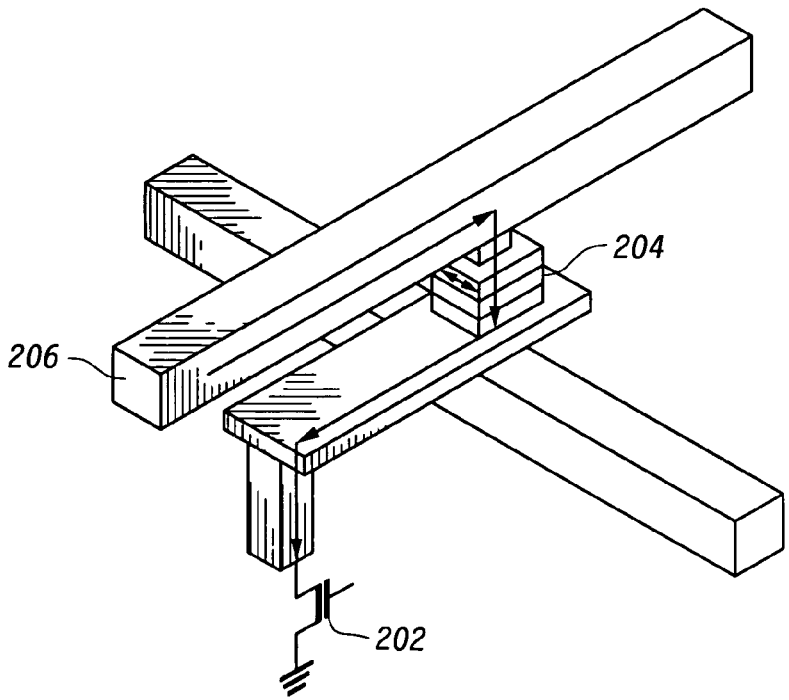
FIG. 2 illustrates a read mode operation of an MRAM bit.

FIG. 2 illustrates a read mode operation of an MRAM bit. In a read mode, isolation transistor 202 is turned on. MRAM bit 204 is read by sending current through bit line 206 and sensing a resistance on bit line 206.

Figure 3:
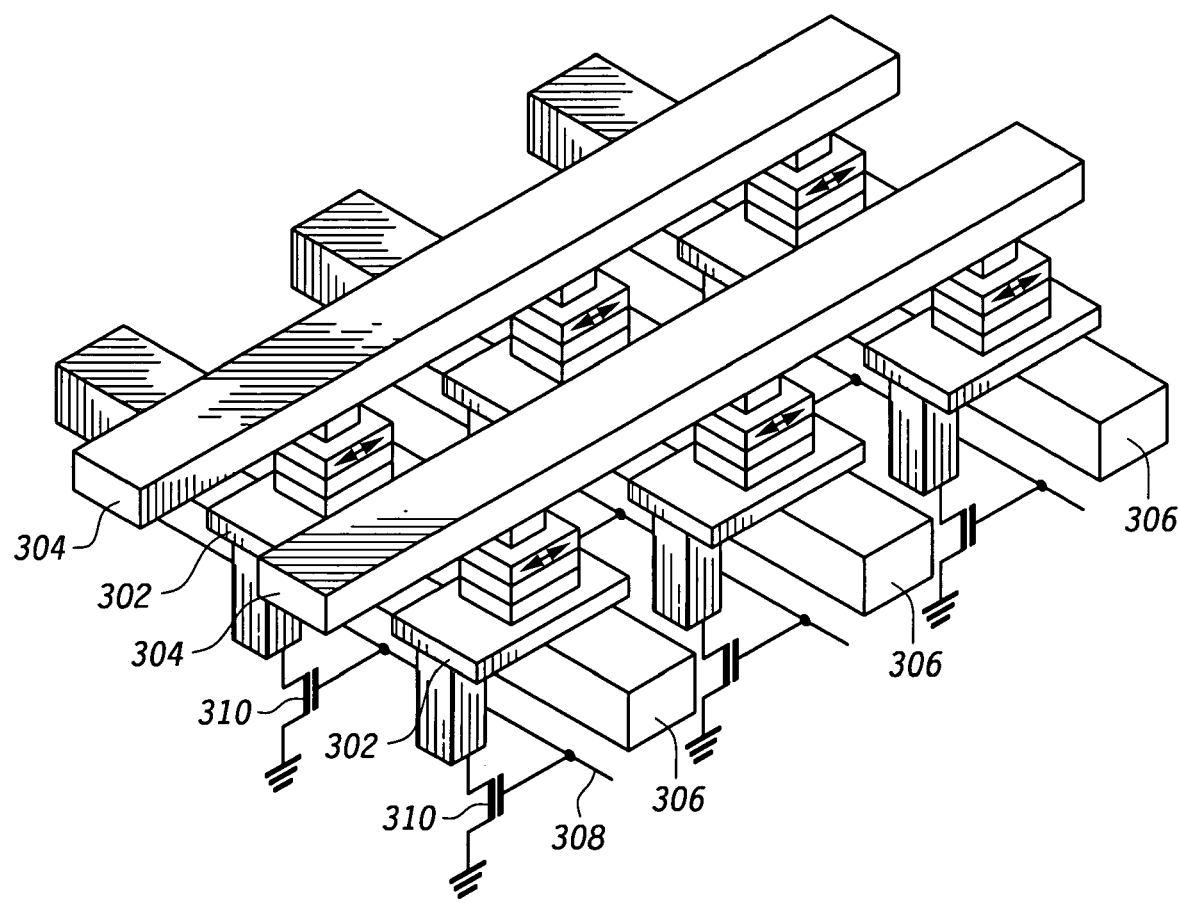
FIG. 3 illustrates an array of MRAM bits.

FIG. 3 illustrates an array of MRAM bits. Multiple MRAM bits 302 can be formed in an array. Multiple bit lines 304 and multiple digit lines 306 are current carrying lines used for reads and writes. Word line 308 controls isolation transistors 310. To read, current is sent through a particular bit line 304 and a particular word line 308 is used to select a row of MRAM bits 302. The MRAM bit read is at the intersection of the selected word line and the selected bit line.

Figure 4:
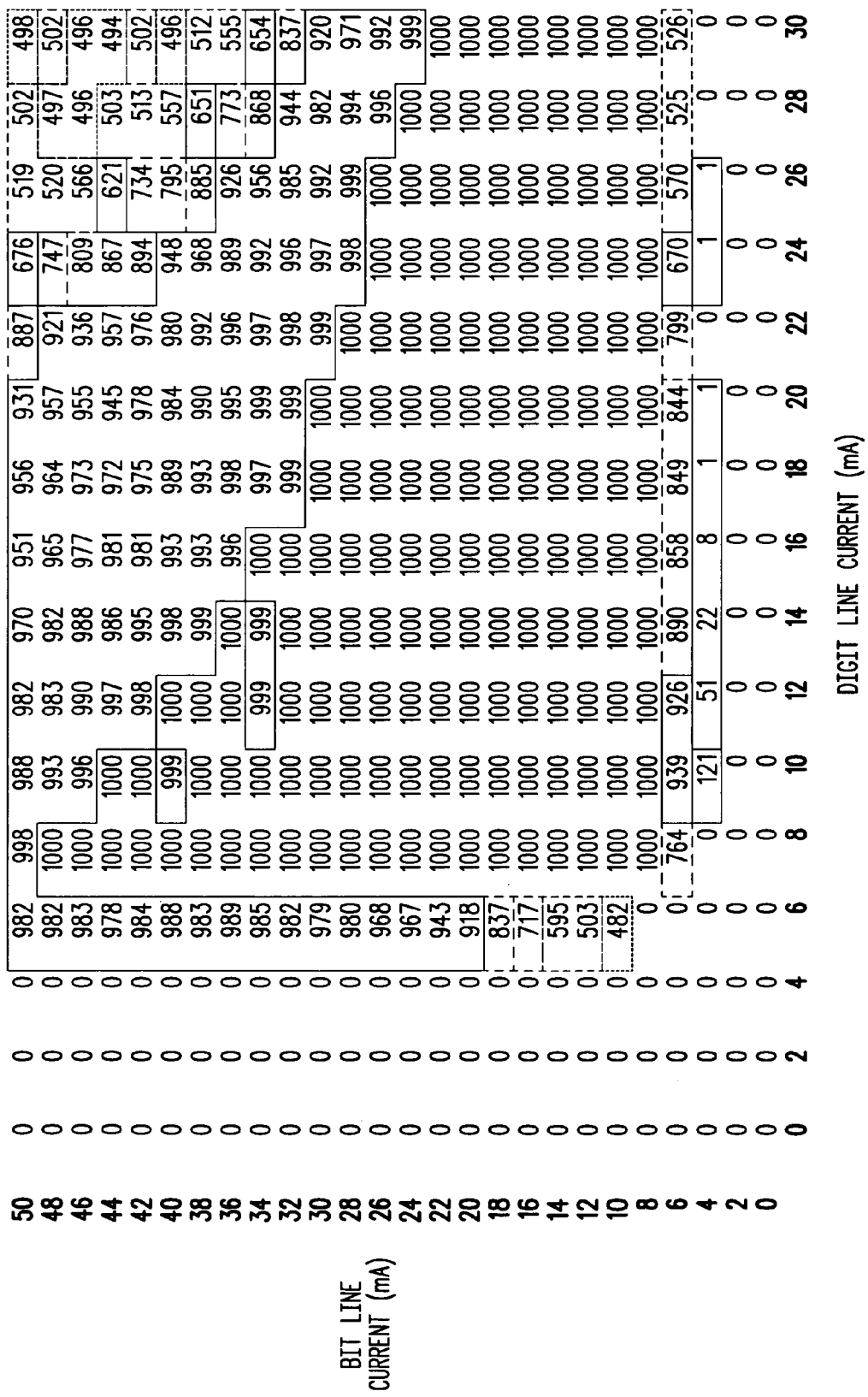
FIG. 4 illustrates a switching count map for a single MRAM bit pulsed 1000 times at various combinations of write currents.

FIG. 4 illustrates a switching count map for a single toggle-mode MRAM bit pulsed 1000 times at each of varying combinations of bit line (y-axis) and digit line (x-axis) current. By varying the bit line current and the digit line current, various patterns of switching a MRAM bit are determined. As shown, for very low currents, the MRAM bit fails to switch. In a transitional area as currents are increased, the MRAM bit switches unreliably, for example, from 1 to 999 times out of 1000 attempts. For mid range currents, the MRAM bit reliably switches 1000 times out of 1000 attempts. For very high currents, the MRAM bit does not switch reliably due to saturation.

FIG. 5 illustrates switching and saturation distributions for toggle-mode MRAM bits in an array according to an embodiment of the present disclosure. As shown, as the current on the bit line ($I_{bitline}$) (x-axis) is increased, the switching reliability travels through multiple switching regions. The current required to switch MRAM bits follows a gaussian distribution, including a switching distribution region 502 and a saturation distribution region 504. At a mean switching current $I_{sw}$ and at a saturation current $I_{sat}$, 50% of the bits in the array switch. At the mean switching current plus six sigma $I_{sw}+6*\sigma_{sw}$, 100% of the bits in the array have enough field applied to be able to switch. "$I_{sw}+6*\sigma_{sw}$" refers to an amount of switching current that provides for less than 1 in $10^9$ unreliably switching bits.

Thus, the optimum current to apply to an array of MRAM cells to ensure reliable switching is $I_{sw}+6*\sigma_{sw}$. However, applying too much current can over-saturate a bit, causing it to no longer switch, or disturb another bit along the same program lines. Additionally, electro migration effects increase with current amplitude. Additionally, power consumed is proportional to the square of current used for writing. Additionally, power dropped in local areas of the chip may cause temperature-dependant parameters to shift non-uniformly, causing performance degradation. Thus, the switch current to be applied should be enough to switch the bits, but lower than the point at which various problems may occur.

According to the present disclosure, MRAM bits are first written utilizing a low-magnitude current pulse, generating a low magnitude magnetic force, for example, a switching current of the mean switching current plus two sigma $I_{sw}+2*\sigma_{sw}$. At $I_{sw}+2*\sigma_{sw}$, tests have shown that approximately 2.3% of attempted bit writes will fail to write due to the low field magnitude. Those bits that fail to write are written with a second, higher magnitude current pulse, of sufficient magnitude to ensure writing on the second attempt, for example, mean switching current plus six sigma $I_{sw}+6*\sigma_{sw}$.

According to the present disclosure, any low magnitude current less than $I_{sw}+6*\sigma_{sw}$ can be applied to achieve power savings, followed by a higher magnitude current for those bits that fail to write.

FIG. 6 illustrates a flow 600 of a reduced power write method according to an embodiment of the present disclosure. An MRAM bit is read, step 602, for example, utilizing a method as shown in FIG. 2 or other method of reading an MRAM bit. A determination is made whether the bit requires writing to achieve the desired value, step 604. If so, a magnetic field having a low magnitude is applied to the MRAM bit, step 606. The MRAM bit is read again, step 608. A determination is made whether the magnetic field having the low magnitude caused the MRAM bit to store the desired value, step 610. If not, a magnetic field having a higher magnitude is applied to the MRAM bit, step 612.

Flow 600 describes the flow for toggle mode writes. When performing conventional mode writes, steps 602 and 604, reading of the MRAM bit and determining if the bit needs writing, is not necessary.

Some applications may require an especially high degree of write reliability. It is possible that a given bit can have a certain probability of switching at a given magnetic field magnitude. If one or more of the bits does not switch to the correct state 100% of the time at a given magnetic field magnitude, the reliability of the memory can be greatly improved by having additional write and read cycles following each failed write attempt. In this embodiment, the bit would be written at a certain field magnitude and a determination would be made whether the bit has switched to the desired state. If not, one or more subsequent write-read sequences of the same or different field magnitude may follow until the bit has been written to the desired state.

Flow 600 can achieve a power savings of 50% for a reasonable case of 16-bit word simultaneous writes where $\sigma_{sw}=15\%$ of $I_{sw}$ and the initial write attempt is $I_{sw}+2*\sigma_{sw}$. Additionally, flow 600 allows for a smaller operating window where $I_{sat}$ can be decreased and $I_{sw}$ be made smaller resulting in further power savings. Overall, lower mean switching current results in a reduction of electro migration effects on the current carrying lines resulting in a significant increase in the lifetime and reliability of the MRAM device. Additionally, a reduction of joule heating during write operations occurs, increasing performance because MRAM performance tends to decline as temperature increases.

FIG. 7 illustrates another flow 700 of a reduced power write method according to an embodiment of the present disclosure. A write-read sequence utilizing a low magnitude magnetic field is applied to the MRAM bit, step 702. A determination is made whether the magnetic field with the low magnitude caused the MRAM bit to meet an objective, for example, write reliably, step 704. If not, a result of the determination is stored, step 706. For example, a bit in memory or a fuse can be set or cleared or a memory bit may be permanently damaged. Any subsequent writes to the MRAM bit will utilize a magnetic field having a higher magnitude, step 708. If the magnetic field with the low magnitude caused the MRAM bit to write reliably, any subsequent writes to the MRAM bit will utilize the magnetic field having the low magnitude, step 710, unless it is necessary that one or both of the program lines that intersect the bit produce a high field in order to switch another bit along the line.

Steps 702–706 can occur during system test or system initialization and the result stored.

Flow 700 can achieve a power savings of as much as 35% for a reasonable case of $\sigma_{sw}=15\%$. A reduction of joule heating during write operations occurs, increasing performance. Additionally, flow 700 has improved speed efficiency because flow 700 does not suffer the speed penalty that would be seen in flow 600 because the high current lines are hard-coded and a post-read is not required.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    applying a first current pulse having a first current level to a strip line of a magneto resistive memory cell; and
    applying a second current pulse having a second current level to the strip line of the magneto resistive memory cell, wherein the second current level is higher than the first current level;
    wherein the first magnetic field failed to write a desired value to the magneto resistive memory cell, wherein the second magnetic field is stronger than the first magnetic field and wherein the magneto resistive memory cell is one of a plurality of magneto resistive memory cells arrayed with a plurality of rows and a plurality of columns; and
    wherein the strip line is one of a digit line for a plurality of magneto resistive memory cells, a row line for a plurality of magneto resistive memory cells, a bit line for a plurality of magneto resistive memory cells, or a column line for a plurality of magneto resistive memory cells.

2. The method, as recited in claim 1, wherein applying a first magnetic field comprises a toggle write mode.

3. The method, as recited in claim 1, wherein applying a first magnetic field comprises a direct write mode.

4. The method, as recited in claim 1, wherein applying a first magnetic field comprises a conventional write mode.

5. A method comprising:
    applying a first magnetic field to a magneto resistive memory cell; and
    applying a second magnetic field to the magneto resistive memory cell;
    performing a read of the magneto resistive memory cell to determine the stored value prior to applying the first magnetic field; and
    performing another read of the magneto resistive memory cell after applying the first magnetic field;
    wherein the first magnetic field failed to write a desired value to the magneto resistive memory cell, wherein the second magnetic field is stronger than the first magnetic field and wherein the magneto resistive memory cell is one of a plurality of magneto resistive memory cells arrayed with a plurality of rows and a plurality of columns.

6. The method, as recited in claim 5, wherein the applying the first magnetic field occurs only if the stored value is not in a desired state.

7. The method, as recited in claim 5, wherein applying the first magnetic field occurs during system test, the method further comprising:
    determining that the first magnetic field is not sufficient to reliably write the desired value; and
    storing a result of the determination such that subsequent applications of magnetic fields to the magneto resistive memory cell utilize a force level of the second magnetic field.

8. The method, as recited in claim 7, wherein storing the result comprises setting a fuse.

9. The method, as recited in claim 7, wherein storing the result comprises setting a memory bit.

10. The method, as recited in claim 7, wherein storing the result comprises damaging a memory bit.

11. The method, as recited in claim 7, wherein the subsequent applications of magnetic fields are applied to a row of magneto resistive memory cells.

12. The method, as recited in claim 7, wherein the subsequent applications of magnetic fields are applied to a column of magneto resistive memory cells.

13. A method comprising:
applying a first magnetic field to a plurality of magneto resistive memory cells during system test; and
determining that the first magnetic field is not sufficient to reliably write at least one of the plurality of memory cells; and
storing a result of the determination such that subsequent applications of magnetic fields to the select ones of the plurality of magneto resistive memory cells utilize a force level of a second magnetic field; and
applying the a second magnetic field to select ones of the plurality of magneto resistive memory cells;
wherein the first magnetic field failed to write a desired value to at least one stored value in the select ones of the magneto resistive memory cells and wherein the second magnetic field is stronger than the first magnetic field;
wherein the plurality of magneto resistive memory cells are arranged in an array and the select ones of the plurality of magneto resistive memory cells are a row of the array; and
wherein the first magnetic field has a force less than a magnetic field necessary to reliably write the plurality of magneto resistive memory cells.

14. The method, as recited in claim 13, wherein storing the result comprises setting a fuse.

15. The method, as recited in claim 13, wherein storing the result comprises damaging a memory bit.

16. The method, as recited in claim 13, wherein the subsequent applications of magnetic fields are applied to a row of the plurality of magneto resistive memory cells.

17. The method, as recited in claim 16, wherein the subsequent applications of magnetic fields are applied to a column of the plurality of magneto resistive memory cells.

18. The method, as recited in claim 13, wherein the subsequent applications of magnetic fields are applied to a column of the plurality of magneto resistive memory cells.

19. A method comprising:
applying a first magnetic field to a magneto resistive memory cell; and
applying a second magnetic field to the magneto resistive memory cell;
wherein the first magnetic field failed to write a desired value to the magneto resistive memory cell, wherein the second magnetic field is stronger than the first magnetic field, wherein the magneto resistive memory cell is one of a plurality of magneto resistive memory cells arrayed with a plurality of rows and a plurality of columns, and wherein applying the first magnetic field comprises a writing mode consisting from the group of a toggle write mode, a direct write mode and a conventional write mode.

20. The method, as recited in claim 19, wherein a first magnetic field is applied utilizing a toggle write mode.

21. The method, as recited in claim 19, wherein a first magnetic field is applied utilizing a direct write mode.

22. The method, as recited in claim 19, wherein a first magnetic field is applied utilizing a conventional write mode.

23. A method comprising:
applying a first current pulse having a first current level to a magneto resistive memory cell, wherein the first current level is less than a current level necessary to switch every stored value in a plurality of magneto resistive memory cells; and
applying a second current pulse having a second current level to the magneto resistive memory cell, wherein the second current level is higher than the first current level;
wherein the first magnetic field failed to write a desired value to the magneto resistive memory cell, wherein the second magnetic field is stronger than the first magnetic field and wherein the magneto resistive memory cell is one of a plurality of magneto resistive memory cells arrayed with a plurality of rows and a plurality of columns.

24. A method comprising:
applying a first magnetic field to a plurality of magneto resistive memory cells during system test; and
determining that the first magnetic field is not sufficient to reliably write at least one of the plurality of memory cells; and
storing a result of the determination such that subsequent applications of magnetic fields to the select ones of the plurality of magneto resistive memory cells utilize a force level of a second magnetic field, wherein storing the result comprises setting a memory bit; and
applying the a second magnetic field to select ones of the plurality of magneto resistive memory cells;
wherein the first magnetic field failed to write a desired value to at least one stored value in the select ones of the magneto resistive memory cells and wherein the second magnetic field is stronger than the first magnetic field.

25. A method comprising:
applying a first current pulse having a first current level to a magneto resistive memory cell, wherein the first current level is less than six sigma above a mean switching current; and
applying a second current pulse having a second current level to the magneto resistive memory cell, wherein the second current level is higher than the first current level;
wherein the first magnetic field failed to write a desired value to the magneto resistive memory cell, wherein the second magnetic field is stronger than the first magnetic field and wherein the magneto resistive memory cell is one of a plurality of magneto resistive memory cells arrayed with a plurality of rows and a plurality of columns.

26. A method comprising:
applying a first magnetic field to a magneto resistive memory cell; and
applying a second magnetic field to the magneto resistive memory cell;
wherein the first magnetic field failed to write a desired value to the magneto resistive memory cell, wherein the second magnetic field is stronger than the first magnetic field and wherein the magneto resistive memory cell is one of a plurality of magneto resistive memory cells arrayed with a plurality of rows and a plurality of columns; and
wherein a structure of the magneto resistive memory cell structure comprises a magneto resistive memory element adjacent to a bit strip line and a digit strip line; and
wherein applying current pulses to at least one of the word strip line and the digit strip line causes a value to be stored in the magneto resistive memory cell.

* * * * *